US009986643B2

(12) United States Patent
Güte (10) Patent No.: US 9,986,643 B2
(45) Date of Patent: May 29, 2018

(54) CIRCUIT BOARD FOR DISPLAY AND DISPLAY MODULE WITH DISPLAY AND CIRCUIT BOARD

(75) Inventor: Andreas Güte, Hong Kong (HK)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 843 days.

(21) Appl. No.: 13/696,683

(22) PCT Filed: May 4, 2011

(86) PCT No.: PCT/EP2011/057166
§ 371 (c)(1),
(2), (4) Date: Mar. 18, 2013

(87) PCT Pub. No.: WO2011/138382
PCT Pub. Date: Nov. 10, 2011

(65) Prior Publication Data
US 2013/0176693 A1    Jul. 11, 2013

(30) Foreign Application Priority Data

May 7, 2010    (DE) ......................... 10 2010 019 841

(51) Int. Cl.
*G06F 3/041*    (2006.01)
*H05K 1/18*    (2006.01)
(Continued)

(52) U.S. Cl.
CPC ........... *H05K 1/189* (2013.01); *H03K 17/962* (2013.01); *H05K 1/028* (2013.01); *H05K 7/00* (2013.01);
(Continued)

(58) Field of Classification Search
CPC    H05K 1/189; H05K 9/00; H05K 7/00; H05K 13/00; H05K 1/028; H05K 3/361;
(Continued)

(56) References Cited

U.S. PATENT DOCUMENTS 6,002,594 A    12/1999  Ledin et al. ................... 361/803
6,215,476 B1 *  4/2001  Depew ................... G06F 3/0412
                                                        178/18.01
(Continued)

FOREIGN PATENT DOCUMENTS

CN        101685118 A    3/2010   ............. G01R 27/26
EP          1898295 A2    3/2008   ............... G06F 1/16
(Continued)

OTHER PUBLICATIONS

European Office Action, Application No. 11718718, 6 pages, dated Feb. 3, 2015.
(Continued)

*Primary Examiner* — Steven T Sawyer
(74) *Attorney, Agent, or Firm* — Slayden Grubert Beard PLLC (57) ABSTRACT

A display circuit board is provided with at least one section being configured as flexible circuit board, wherein the at least one flexible section of the display circuit board has at least one electrode being coupleable with a capacitive sensor device. Furthermore, a display module is provided with a display and a display circuit board. In addition, a method for the production of a display module is provided, wherein the display circuit board is inserted in a module housing together with the display in such a way that the flexible section is at least partially arranged between a side wall of the display and a side wall of the module housing. Finally, an electrical hand-held device, such as a cell phone or the like, is provided with a display module.

18 Claims, 8 Drawing Sheets

(51) Int. Cl.
  *H03K 17/96*  (2006.01)
  *H05K 1/02*  (2006.01)
  *H05K 7/00*  (2006.01)
  *H05K 9/00*  (2006.01)
  *H05K 13/00*  (2006.01)
  *G02F 1/1345*  (2006.01)
  *H05K 1/11*  (2006.01)
  *H05K 1/14*  (2006.01)
  *H05K 1/16*  (2006.01)

(52) U.S. Cl.
  CPC ............ *H05K 9/00* (2013.01); *H05K 13/00* (2013.01); *G02F 1/13452* (2013.01); *H03K 2217/96031* (2013.01); *H03K 2217/96046* (2013.01); *H03K 2217/960755* (2013.01); *H05K 1/118* (2013.01); *H05K 1/147* (2013.01); *H05K 1/162* (2013.01); *H05K 2201/10151* (2013.01); *Y10T 29/49002* (2015.01)

(58) Field of Classification Search
  CPC . H03K 17/962; Y10T 29/49002; G06F 3/044; G02F 1/1345; G02F 1/13452; G02F 1/13454
  USPC .............. 361/679.3, 679.56, 749; 174/254; 345/173; 349/149–151, 57, 61
  See application file for complete search history.

(56) References Cited

U.S. PATENT DOCUMENTS

| | | | |
|---|---|---|---|
| 6,664,661 B1 | 12/2003 | Palata et al. | 307/112 |
| 7,158,124 B2* | 1/2007 | Nakajima | G06F 3/041 345/173 |
| 7,221,414 B2 | 5/2007 | Nishiura et al. | 349/58 |
| 7,242,323 B2 | 7/2007 | Sato et al. | 341/33 |
| 7,633,564 B2 | 12/2009 | Hong et al. | 349/12 |
| 8,816,967 B2 | 8/2014 | Lyon et al. | 345/173 |
| 8,854,320 B2 | 10/2014 | Hirata et al. | 345/173 |
| 2002/0158838 A1 | 10/2002 | Smith et al. | 345/156 |
| 2004/0070572 A1* | 4/2004 | Nakajima | G06F 3/041 345/173 |
| 2004/0222974 A1* | 11/2004 | Hong | G06F 3/045 345/173 |
| 2006/0119761 A1* | 6/2006 | Okuda | G02F 1/13452 349/58 |
| 2007/0034402 A1* | 2/2007 | Cheng | G02F 1/13452 174/260 |
| 2008/0053713 A1* | 3/2008 | Huang et al. | 178/18.03 |
| 2009/0067124 A1* | 3/2009 | Lai | G02F 1/13452 361/679.01 |
| 2009/0115738 A1* | 5/2009 | Chueh | G02F 1/133308 345/173 |
| 2009/0161325 A1* | 6/2009 | Kirmayer | 361/752 |
| 2009/0257207 A1* | 10/2009 | Wang | G06F 1/1626 361/752 |

FOREIGN PATENT DOCUMENTS

| | | | |
|---|---|---|---|
| EP | 1924000 A2 | 5/2008 | H03K 17/96 |
| GB | 2331204 A | 5/1999 | G06F 1/16 |
| JP | 11-143604 A | 5/1999 | G06F 1/16 |
| JP | 2002-333951 A | 11/2002 | G06F 3/00 |
| JP | 2004-133909 A | 4/2004 | G06F 1/16 |
| JP | 2004-146099 A | 5/2004 | A63H 11/00 |
| JP | 2004-213610 A | 7/2004 | G02F 1/1333 |
| JP | 2005339856 A | 12/2005 | G01V 3/08 |
| JP | 2006-010967 A | 1/2006 | B60R 11/02 |
| JP | 2007072902 A | 3/2007 | G06F 3/041 |
| JP | 2007-207275 A | 8/2007 | G06F 3/041 |
| JP | 2008-059589 A | 3/2008 | G06F 1/16 |
| JP | 2009-099067 A | 5/2009 | G06F 3/033 |
| JP | 2010-026638 A | 2/2010 | G06F 3/041 |
| WO | 2011/138382 A1 | 11/2011 | G01D 5/24 |

OTHER PUBLICATIONS

International Search Report and Written Opinion, Application No. PCT/EP2011/057166, 5 pages, dated Sep. 19, 2011.
International Preliminary Report on Patentability, Application No. PCT/EP2011/057166, 4 pages, dated Nov. 13, 2012.
Chinese Office Action, Application No. 201180027343.1, 9 pages, dated Nov. 12, 2015.
Japanese Office Action, Application No. 2013-508495, 15 pages, dated Dec. 18, 2015.
Chinese Office Action, Application No. 201180027343.1, 9 pages, dated May 30, 2016.
Japanese Final Office Action, Application No. 2013508495, 18 pages, dated Oct. 28, 2016.
Korean Office Action, Application No. 20127031900, 5 pages, dated Aug. 20, 2017.
Chinese Office Action, Application No. 201180027343.1, 15 pages, dated Feb. 11, 2015.
Japanese Office Action, Application No. 2013-508495, 22 pages, dated Mar. 16, 2015.
Korean Office Action, Application No. 20127031900, 5 pages, dated Feb. 28, 2018.

\* cited by examiner

CIRCUIT BOARD FOR DISPLAY AND DISPLAY MODULE WITH DISPLAY AND CIRCUIT BOARD

CROSS-REFERENCE TO RELATED APPLICATIONS

This application is a U.S. National Stage Application of International Application No. PCT/EP2011/057166 filed May 4, 2011, which designates the United States of America, and claims priority to German Application No. 10 2010 019 841.2 filed May 7, 2010, the contents of which are hereby incorporated by reference in their entirety.

TECHNICAL FIELD

The present invention relates to a display circuit board for a display, such as a LCD display, a TFT display or an OLED display. Furthermore, the invention relates to a display module with a display and a display circuit board according to the present invention as well as a method for the production of a display module according to the invention. Furthermore, the invention relates to an electrical hand-held device with a display module according to the invention.

SUMMARY

According to various embodiments, solutions can be provided in order to simply design an electrical hand-held device, such as a cell phone, with a capacitive sensor device, for example, for the approximation detection, touch detection and/or gesture detection.

This and other objects can be achieved according to various embodiments, by a display circuit board comprising at least one section being configured as a flexible circuit board, wherein the at least one flexible section of the display circuit board comprises at least one electrode being coupleable with a capacitive sensor device.

BRIEF DESCRIPTION OF THE DRAWINGS

The figures show schematically simplified embodiments, which are further specified in the following description as follows.

DETAILED DESCRIPTION

According to various embodiments, a display circuit board comprising at least one section being configured as flexible circuit board, characterized in that the at least one flexible section of the display circuit board comprises at least one electrode being coupleable with a capacitive sensor device.

This way, the production of the electrodes of the capacitive sensor device can be integrated in the production process of the display circuit board in a particularly simple way so that the electrodes can be produced together with the other electrical structures to be produced on the display circuit board. A separate production of the electrodes of a capacitive sensor device is thus avoided. The connection of the electrodes, such as to a main circuit board of the electrical hand-held device can be established via the display circuit board connection being provided at the display circuit board in any case, so there is no need for a complex connecting of the electrodes with the main circuit board of the electrical hand-held device, for example by means of soldering.

The capacitive sensor device comprises at least one electric circuit being configured to determine the capacitance at the electrode or an electric current flowing in the electrode. The electric circuit can be configured alternatively or additionally to apply an alternating electrical signal to the electrode. The capacitive sensor device can also be integrated in the electric circuit of a display driver on the display circuit board. The capacitive sensor device can be configured as integrated circuit.

It should be appreciated that at least one rim portion of the display circuit board is configured as flexible section of the display circuit board. This way, individual electrodes of the capacitive sensor device can be placed in the rim portion in the display module housing when inserting the display circuit board in the housing of a display module, which can be particularly advantageous for the detection of the gripping of the hand-held device with one hand with the display module being integrated in the hand-held device.

It has proven advantageous, when at least the portion comprising the electrode of the flexible section of the display circuit board protrudes beyond the rim portion of the display with the display being arranged on the display circuit board.

It is advantageous that the display circuit board and the display being arranged on the display circuit board can be inserted in a housing of a display module in such a way that the flexible sections of the display circuit board protruding beyond the display are pressed against a display frame of the display.

It should be appreciated that the capacitive sensor device is arranged on the display circuit board. Thus, the entire electronics for the detection and the analysis of a change of capacitance can be advantageously integrated at the electrode on the display circuit board. The result of the analysis can be provided at the display circuit board connection being provided at the display circuit board in any case or be supplied to the main circuit board of the electrical hand-held device via the display circuit board connection. Furthermore, an entire display module already comprising the capacitive sensor device and the electrodes of the capacitive sensor device can be advantageously provided.

The at least one electrode can be configured as conductive track of the display circuit board. Thus, existing manufacturing structures can be used to produce the electrodes on the display circuit board. Alternatively, other electroconductive structures, such as thin metal sheets or electroconductive paint, can be used to develop or produce the electrodes.

The at least one electrode can be electrically shielded. This ensures that when integrating the display circuit board in the housing of a display module, there are no electrical connections to other elements in the housing or to the housing itself or a field emitted by the housing reaches or couples into the electrode, which would result in an unintentional increase of the electrode surface.

On the other hand, the at least one electrode can be configured in such a way that it establishes a connection to the housing of the display module or to a housing member being electrically shielded against the remaining housing of the display module, such as to an individual side wall of the housing. For this, the electrode can be configured with a sufficiently large coupling capacity. Thus, the electrode surface can be increased deliberately.

According to other embodiments, a display module can be provided with a display and a display circuit board, wherein at least one section of the display circuit board is configured as flexible circuit board and wherein the at least one flexible section of the display circuit board comprises at least one electrode being coupleable with a capacitive sensor device.

Arranging the electrodes of the capacitive sensor device on the display circuit board considerably simplifies the manufacturing process of an electrical hand-held device with a capacitive sensor device since the electrodes required for the capacitive sensor device no longer have to be arranged individually in the housing of the electrical hand-held device, but are already integrated in the display module, which is also inserted in the housing of the electrical hand-held device.

The display module can comprise a module housing, in which the display and the display circuit board are arranged, wherein at least that part of the at least one flexible section of the display circuit board comprising the electrode abuts against the inside of a side wall of the module housing. The arrangement of the electrodes on the side wall of the module housing is particularly advantageous for the detection of a gripping of an electrical hand-held device with one hand with the display module being integrated in the electrical hand-held device.

Preferably, the module housing may be made of plastic.

The display module can comprise a module housing, in which the display and the display circuit board are arranged, wherein at least that part of the at least one flexible section of the display circuit board comprising the electrode is led out of the module housing. The display module can be inserted in a housing of an electrical hand-held device in such a way that the flexible sections of the display circuit board being led out of the module housing are arranged between a side wall of the housing of the electrical hand-held device and a side wall of the module housing. The module housing can be made of metal.

A display circuit board connection can be led out of the module housing. The display circuit board connection can be configured as flexible circuit board. The electrodes can be coupled with a main circuit board of the electrical hand-held device via the display circuit board connection.

It is particularly advantageous, when the capacitive sensor device is arranged on the display circuit board, wherein sensor signals of the capacitive can be tapped at the display circuit board connection. Thus, a display module can be provided, also comprising, in addition to the required electronic components for the operation of the display, the electronic components required for an approximation detection, touch detection and/or gesture detection. The capacitive sensor device can also be integrated in the electric circuit of a display driver being configured as integrated circuit on the display circuit board.

The display circuit board can comprise four electrodes, wherein the first electrode, the second electrode and the third electrode are provided for a touch detection and the fourth electrode together with the first electrode and/or the second electrode and/or the third electrode are provided for an approximation detection. Thus, a touch detection and an approximation detection can be put into effect, wherein the approximation detection is activated as soon as a touch of the electrical hand-held device is detected.

According to the various further embodiments, an electrical hand-held device is also provided with a display module according to the display module.

Furthermore, according to various further embodiments, a method for the production of a display module may comprise
 a display being arranged at least partially on a display circuit board comprising at least one section being configured as flexible circuit board, wherein the at least one flexible section of the display circuit board comprises at least one electrode being coupleable with a capacitive sensor device and wherein the at least one flexible section protrudes beyond the rim portion of the display; and
 a module housing.

According to the method according to various further embodiments, the display circuit board is inserted in the module housing together with the display in such a way that the at least one flexible section is at least partially arranged between a side wall of the display and a side wall of the module housing.

It is advantageous to arrange at least that part of the flexible section comprising the electrode between the side wall of the display and the side wall of the module housing.

Thus, the electrodes are automatically arranged correctly by inserting the display or the display circuit board into the module housing, i.e. where they need to be arranged according to the application of the capacitive sensor device.

Further advantages and embodiments can be found in the description, the figures and the claims.

Figure 1:
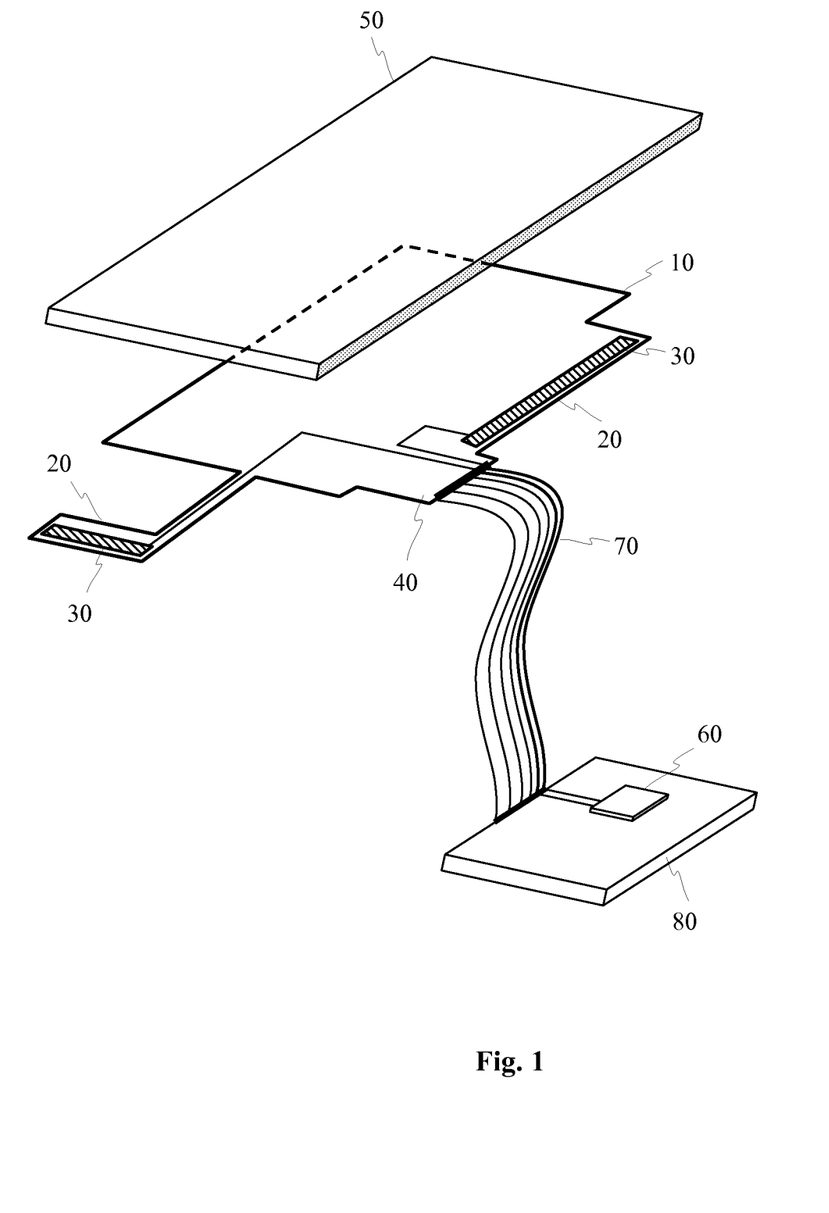
FIG. 1 a display circuit board according to various embodiments, wherein the to capacitive sensor device is arranged on a main circuit board.

FIG. 1 shows a display circuit board 10 according to the various embodiments, which is connected with a main circuit board 80 of an electrical hand-held device, such as a cell phone, via a display connection 70. The main circuit board comprises the electrical components required for the operation of an electrical hand-held device.

For a better understanding, FIG. 1 shows a display 50, which can be at least partially arranged on the display circuit board 10. The display can be, for example, a LED display, an OLED display, a LCD display or a TFT display. The display 50 is contacted with the display circuit board 10 in order to control the display. Depending on the embodiment or design of the display 50, the display circuit board 10 can substantially have the same dimensions as the display 50. The display circuit board 10 can also have a stripe-shaped form in order to be arranged at a rim portion of the bottom side of the display for contacting the display with the display circuit board.

In the example shown in FIG. 1, the display circuit board 10 has approximately the same dimensions as the display 50. Those sections of the display circuit board 10 on which the display 50 is arranged, can be configured as rigid or stable circuit board sections. The display circuit board 10 comprises two sections 20 being configured as flexible circuit boards. After arranging the display 50 on the display circuit board 10, said two flexible sections 20 protrude beyond the rim portion of the display 50 (cf. FIG. 3).

An electrode 30 is provided at each flexible section 20, wherein the electrode is coupled with a capacitive sensor device 60 on the main circuit board 80 via the display connection 70. The display connection 70 can be configured as flat cable or as flexible circuit board.

The capacitive sensor device 60 together with the electrodes 30 arranged on the flexible sections 20 of the display circuit board 10 can be, for example, provided for the detection of an approximation to an electrical hand-held device, as soon as the main circuit board 80 and the display circuit board 10 are integrated in an electrical hand-held device together with the display 50. The flexible rim sections 20 may comprise several electrodes 30, respectively. The number and the type of the electrodes 30 can be selected depending on the respective application.

According to an embodiment, the circuit board 10 can also be configured in such a way that it is not arranged at the bottom side of the display 50, but that it is only provided for the connection of the display 50 to, for example, the main circuit board 80. According to this embodiment, the circuit board 10 can be, for example, arranged at the rim portion of the display 50, wherein at least one section of the circuit board 10 being arranged at the rim portion, is configured as flexible section 20 comprising at least one electrode of a capacitive sensor system. According to this embodiment, the circuit board 10 can be set up by a known display connection, wherein the display connection provides additional flexible sections 20 for the electrodes 30.

Figure 2:
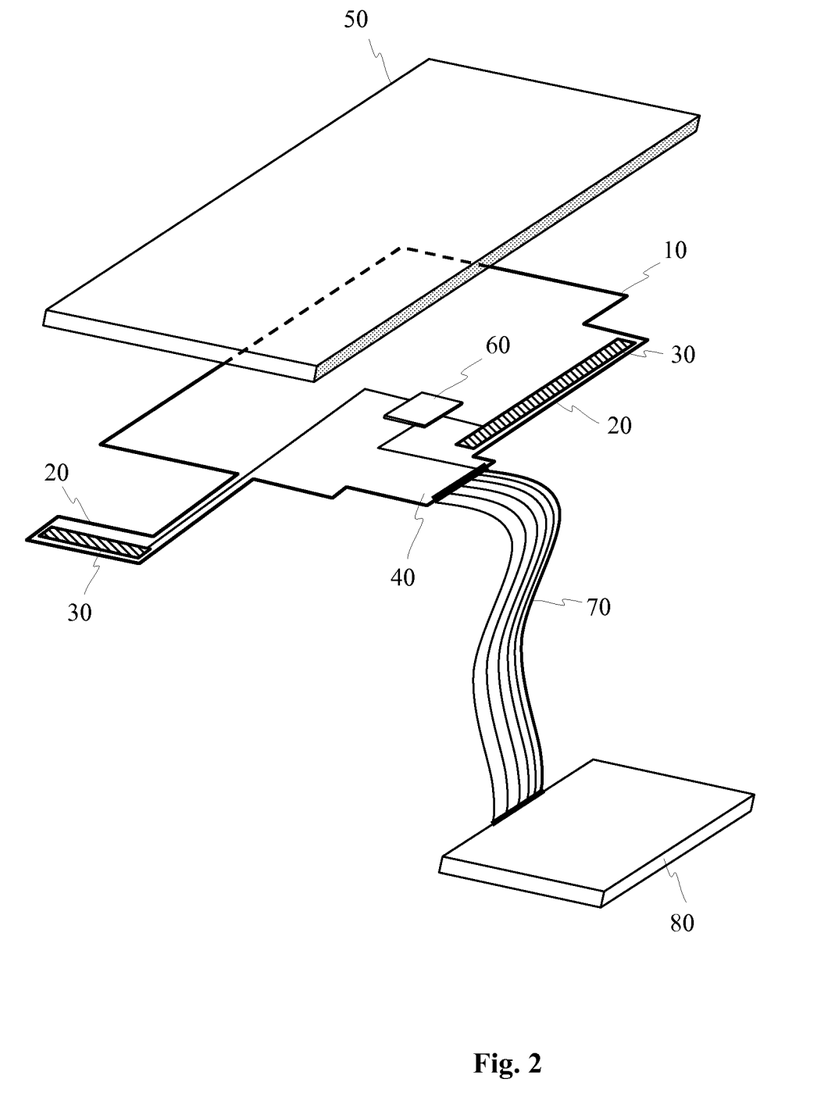
FIG. 2 a second embodiment of the display circuit board according to various embodiments, wherein the capacitive analysis device is arranged on the display circuit board.

FIG. 2 shows the display circuit board 10 according to FIG. 1. Furthermore, the capacitive sensor device 60 is also arranged on the display circuit board 10 in such a way that the entire sensor electronics of a capacitive sensor system is integrated on the display circuit board 10. The advantage of this is that the detection and the analysis, such as of an approximation to the electrodes 30, can already be performed on the display circuit board 10 by the capacitive sensor device 60.

The results of the analysis can be supplied to the main circuit board 80 of an electrical hand-held device via the display connection 70. Depending on the results of the analysis, the main circuit board 80 can then, for example, turn off the display or set the electrical hand-held device to a sleep mode. The display 50 can be turned off in a known manner via the control lines provided in the display connection 70 for controlling the display 50.

The embodiment of a display circuit board 10 according to FIG. 2 provides an entire display module comprising not only the electronic components required for controlling the display 50, but also an entire capacitive sensor system. Such a display module described in detail with reference to FIGS. 5a and 5b.

The sections 20 of the display circuit board 10 according to FIG. 2 are configured as flexible sections or as flexible circuit board and are arranged in such a way that they protrude beyond the rim portion of the display 50 after arranging the display 50 on the display circuit board 10.

Figure 3:
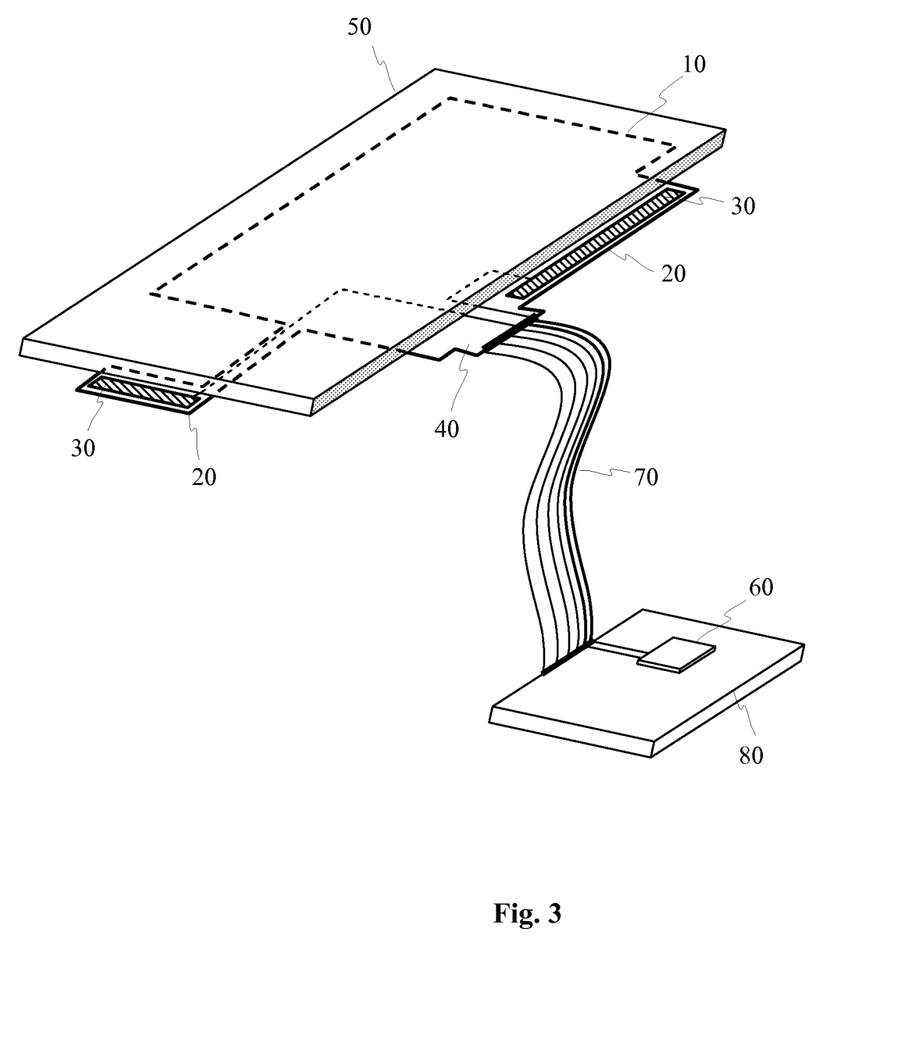
FIG. 3 a display circuit board according to various embodiments, which is arranged at the bottom side of a display.
Figure 4A:
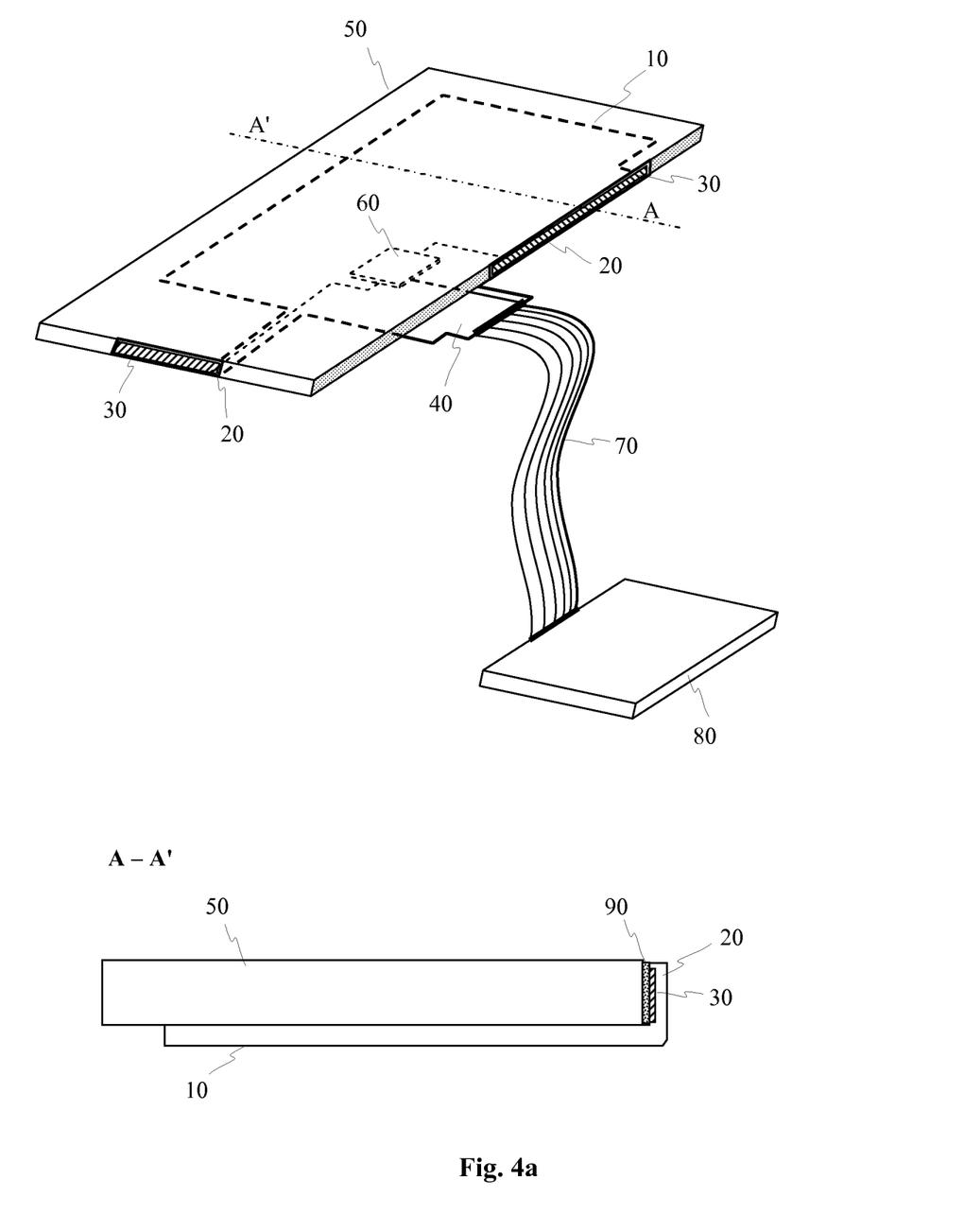
FIG. 4*a* a display circuit board according to various embodiments being arranged at the bottom side of a display, wherein the electrodes or the flexible sections of the display circuit board are folded against the rim of the display.

FIG. 3 shows a display circuit board 10 according to various embodiments, comprising a display 50. The flexible sections 20 of the display circuit board 10 protruding beyond the rim portion of the display 50 are clearly visible. One electrode 30 of the capacitive sensor device 60, being arranged on the main circuit board 80, is arranged at each of the sections 20, respectively, protruding beyond the rim portion of the display 50. Since the sections 20 protruding beyond the rim portion of the display 50 are configured as flexible circuit boards, they can be folded up against the rim of the display 50, as described in detail with reference to FIG. 4.

The display circuit board connection 40 also protruding beyond the rim portion of the display 50 can be configured as flexible circuit board. Alternatively, the display circuit board connection 40 can also be configured as rigid or stable circuit board.

FIG. 4a shows a display circuit board 10 according to various embodiments comprising a display 50, as well as a cross section of the display circuit board 10 and the display 50.

The flexible sections 20 of the display circuit board 10 are folded up against the rim of the display 50, so that the electrodes 30 are arranged along an edge side of the display 50, respectively. The sectional view shows in detail the arrangement of the electrode 30 relative to the display 50 after folding up the flexible section 20 of the display circuit board 10. The display 50 is surrounded by a display frame 90 made of plastic or metal. After folding up the flexible section 20 of the display circuit board 10, the electrode 30 substantially rests on the display frame 90. An additional insulation layer can be arranged between the display frame 90 and the electrode 30, in order to avoid a galvanic connection between an electrically conductive display frame 90 and the electrode 30, which would result in an unintentional increase of the electrode surface.

In an embodiment not shown here, an electrically conductive display frame 90 can also be used as electrode for the capacitive sensor device. The electrode 30 being arranged at the flexible section 20 of the display circuit board can be provided to couple the electrically conductive display frame 90 with the capacitive sensor device 60. In this case, the display frame 90 can also be segmented so that the frame 90 provides several electrodes, which can be coupled with the capacitive sensor device via corresponding electrodes 30.

Using the display frame 90 as electrode or several electrodes for the capacitive sensor device has the advantage that the flexible sections 20 of the display circuit board can be very small, since they only require small electrodes 30 or electrically conductive segments for contacting, i.e. for connecting the display frame or the segments of the display frame with the capacitive sensor device.

Figure 4B:
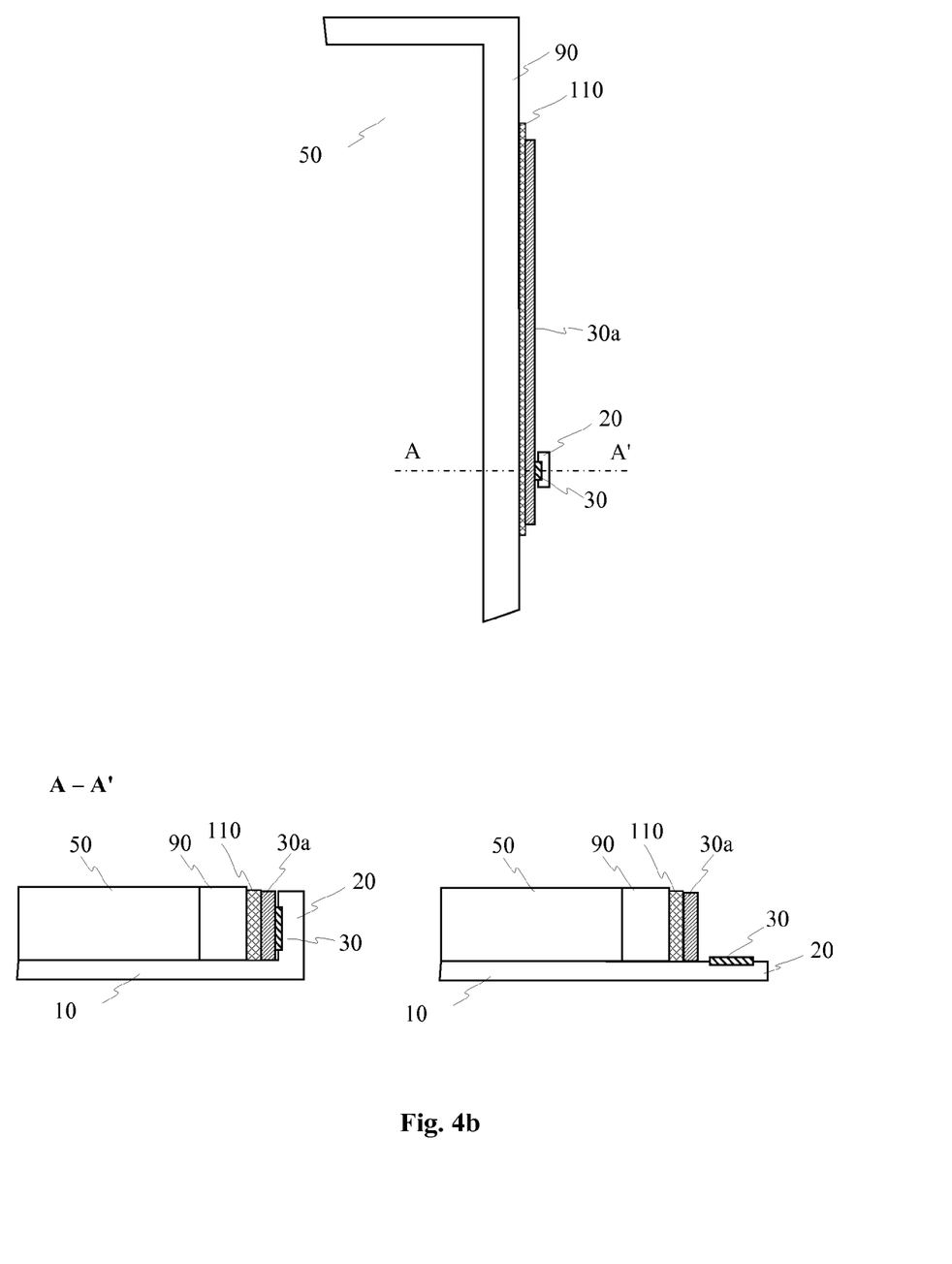
FIG. 4*b* a display frame with applied electrodes.

An insulation layer 110 comprising the electrically conductive areas 30a as electrodes for the capacitive sensor device can also be applied on a metallic or electrically conductive display frame 90. These electrodes 30a can, for example, be manufactured by means of an electrically conductive paint or varnish. FIG. 4b shows such an embodiment.

There is no need for the insulation layer 110 in case of an electrically non-conductive display frame. The electrodes 30a can be applied directly on the display frame, e.g. by means of electrically conductive paint.

Figure 5A:
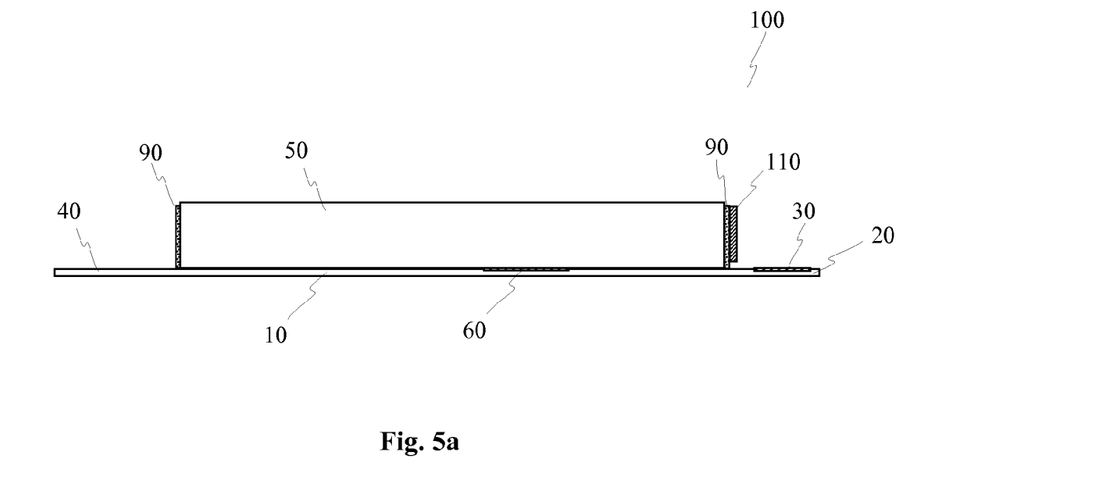
FIG. 5*a* a display module according to various embodiments without module housing.

FIG. 5a shows a sectional view of a display module 100 according to various embodiments. The capacitive sensor device 60 is arranged on the display circuit board 10. The flexible rim section 20 being configured as flexible circuit board comprises an electrode 30, which is connected to the capacitive sensor device 60. The electrode 30 comprises a thin insulation layer, which is not illustrated here. FIG. 5a also shows the display circuit board connection 40, which is part of the display circuit board 10. According to the embodiment illustrated in FIG. 4b, there is no need for this insulation layer. The display 50 is arranged on the display circuit board 10. The display 50 comprises a display frame 90 surrounding the rim portion of the display 50. Said display frame 90 is made of metal. An additional insulation layer 110 is applied on that section of the display frame 90, on which the electrode 30 rests on after folding up the flexible section 20, in order to still better insulate the electrode 30 against the display frame 90.

Figure 5B:
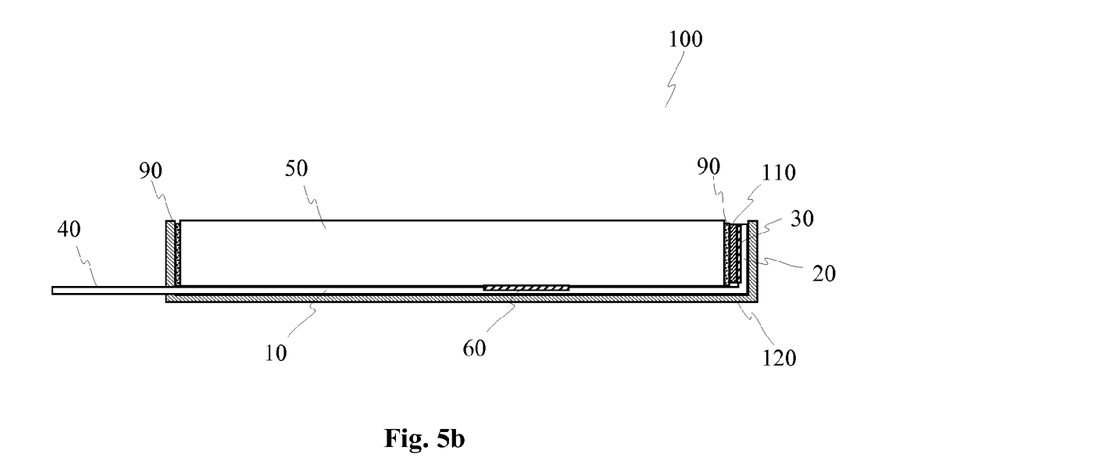
FIG. 5*b* a display module according to various embodiments with module housing.

FIG. 5b shows a complete display module 100 according to various embodiments being integrated in a module housing 120. Preferentially, the module housing 120 can be made of an electrically non-conductive material such as plastic. This illustration shows that the display circuit board connection 40 protrudes beyond the rim portion of the module housing 120 in order to be able to connect the display module to a main circuit board of an electrical hand-held device. When inserting the display circuit board 10 together with the display 50 arranged on it, the flexible section 20 of the display circuit board 10 is folded up through the rim housing wall of the module housing 120.

After having completely inserted the display circuit board 10 and the display 50 into the module housing 120, the electrode 30 as well as the flexible section 20 is substantially arranged between the side wall of the module housing 120 and the side wall of the display 50 or the display frame 90. The housing 120 of the display module is designed in such a way that after inserting the display circuit board and the display into the module housing 120, the electrode 30 is pressed against the display frame 90 by the side wall of the module housing 120.

The display module 100 comprises a known display circuit board connection 40, leading outwards also the control and signal lines of the capacitive sensor device 60. This illustration shows that the electrodes 30 of the capacitive sensor device are completely integrated in the module housing 120. When integrating the display module 100 according to various embodiments into an electrical hand-held device, such as a cell phone, no additional electrodes must be arranged for a capacitive sensor device in the housing of the cell phone, which significantly simplifies the manufacturing of the cell phone.

Figure 6A:
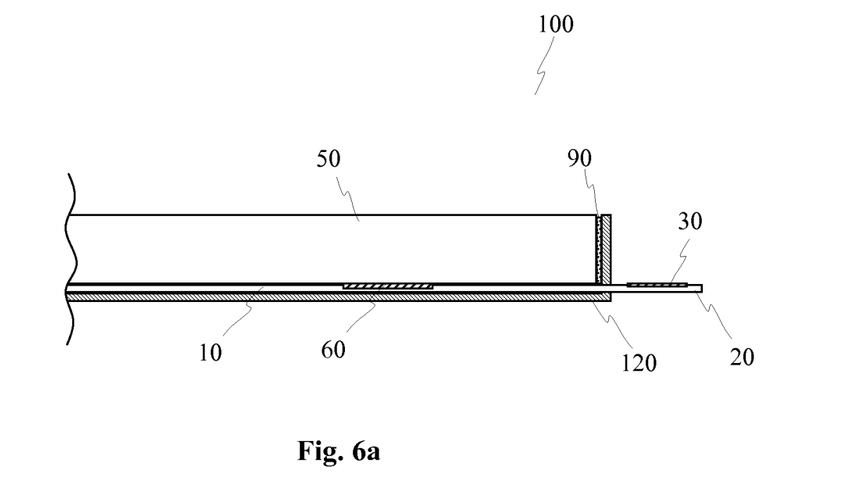
FIG. 6*a* a display module according to various embodiments, wherein the flexible sections of the display circuit board are led out of the module housing.

FIG. 6a shows a display module according to various embodiments with the flexible sections of the display circuit board protruding beyond the module housing. The display circuit board 10 and the display 50 arranged on the display circuit board 10 are inserted in a module housing 120. The module housing 120 comprises openings at the rim portion, through which the flexible sections 20 of the display circuit board are led outwards. Preferentially, such parts of the flexible sections 20 comprising the electrodes 30 may led outwards so that the electrodes 30 arc completely outside the module housing 120. Leading the flexible sections 20 out of the module housing 120 is particularly advantageous when the module housing 120 is made of an electrically conductive material, such as metal. In case of an electrically conductive module housing 120, it can be ensured that an alternating electrical field emitted by an electrode 30 does not directly couple into the module housing 120 and thus does not reach the area outside the module housing 120 with the electrode 30 being arranged on the inside of the module housing 120, as shown with reference to FIG. 5b.

Figure 6B:
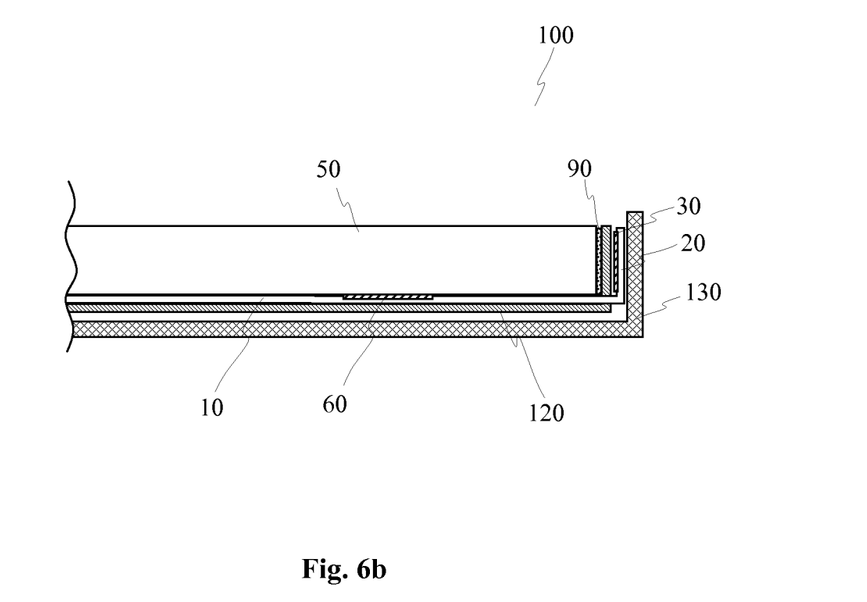
FIG. 6*b* a display module according to various embodiments, which is arranged in a housing of an electrical hand-held device.

FIG. 6b shows a display module 100 according to various embodiments, being arranged in a housing 130 of an electrical hand-held device, such as a cell phone. When inserting the display module in the housing 130, which here is a bottom housing shell of a cell phone, the flexible section 20 is folded up through the side wall of the bottom housing shell and pressed against the outside of the side wall of the module housing 120 or against the inside of the side wall of the bottom housing shell 130. An additional insulation layer can be provided between the electrode 30 and the module housing 120 when the module housing 120 is made of an electrically conductive material in order to avoid an unintentional increase of the electrode 30 due to the electrically conductive module housing 120.

The segmentation of the display frame 90 described with reference to FIG. 4b similarly applies to the module housing 120. For this, sections of the module housing 120 can be configured as electrically non-conductive sections. The electrically conductive sections of the module housing 120 can be coupled with the capacitive sensor device 60 by means of the electrode 30 folded up. In case of a module housing 120 completely made of an electrically conductive material, sections of the module housing 120 can be provided with an insulation layer. Said insulation layer can comprise an electrode, which is coupled with the capacitive sensor device 60 by means of the electrode 30 folded up. Thus, the electrode surface required for the capacitive sensor device can be easily increased. The electrode 30 or the flexible section 20 of the display circuit board 10 can be particularly small, since the electrode 30 is only required for contacting or coupling the electrically conductive sections of the module housing 120 with the capacitive sensor device 60.

Figure 7:
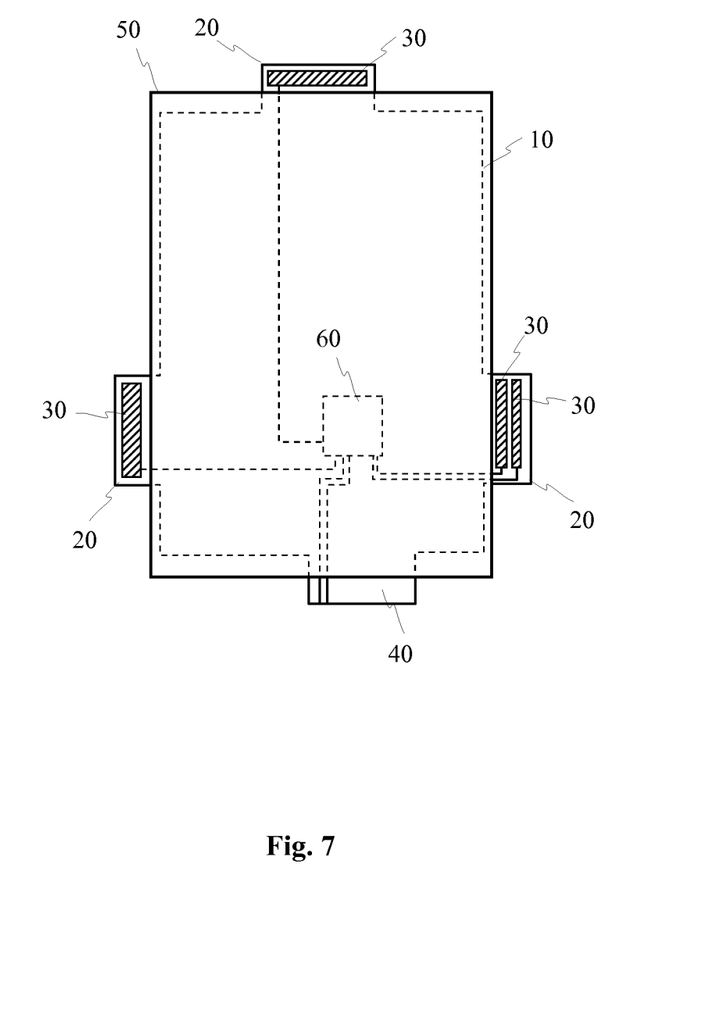
FIG. 7 an embodiment of a display circuit board, which is particularly suitable for the approximation and touch detection.

FIG. 7 shows a particular embodiment of a display circuit board, which is particularly suitable after being integrated in, for example, a cell phone, to detect a gripping of the cell phone and/or an approximation to the cell phone.

The display circuit board 10 is substantially rectangular in shape. The display circuit board 10 comprises a flexible section 20 at its two long sides and at one broad side, respectively. The three flexible sections 20 are configured in such a way that they protrude beyond the rim portion of the display 50 with the display 50 being arranged on the display circuit board 10.

The left flexible section 20 comprises an electrode 30, which can be operated as transmitting electrode for the touch detection, i.e. this electrode transmits an alternating electrical field.

The left flexible section 20 comprises two electrodes 30, wherein one electrode 30 is operated as receiving electrode and the other electrode 30 is operated as compensating electrode. The compensating electrode also transmits an alternating electrical field, which preferentially may have a smaller amplitude than the alternating electrical field transmitted by the transmitting electrode. The compensating electrode also transmits an alternating electrical field, which preferentially may have a phasing different from the alternating electrical field transmitted by the transmitting electrode. The resulting alternating electrical field of the alternating electrical field of the transmitting electrode and the alternating electrical field of the compensating electrode is coupled into in the receiving electrode.

The capacitive sensor device arranged on the display circuit board 10 applies an electrical signal to the transmitting electrode and the compensating electrode, respectively, in order to generate the respective alternating electrical fields. At the same time, the capacitive sensor device 60 is configured to detect a touch, for example of a cell phone, from the alternating electrical fields emitted by the transmitting electrode and the compensating electrode and the alternating electrical field coupled into the receiving electrode.

The arrangement of the transmitting electrode and the receiving electrode or the compensating electrode shown in FIG. 7 is particularly suitable to reliably detect a gripping of a hand-held device with one hand.

Furthermore, the capacitive sensor device 60 is configured to additionally detect an approximation to an electrical hand-held device after having detected a gripping. For this, an electrical signal tapped at the upper electrode 30 can be analyzed, which changes as a function of the capacitive coupling between the left electrode and the upper electrode.

The receiving electrode can also be operated as transmitting electrode for the detection of the approximation, i.e. the receiving electrode also emits an alternating electrical field in the operating mode for detecting the approximation, which is coupled into the upper electrode in case of sufficient approximation to the electrodes by the approximating object.

After the integration of the display circuit board 10 shown in FIG. 7 together with the display 50 in a module housing, as shown with reference to FIG. 5b, the left and the two right electrodes are arranged along the left or the right side wall of the module housing 120, respectively. The upper electrode is arranged along the upper side wall of the module housing 120.

The results of the analysis provided by the capacitive sensor device 60 can be supplied to the main circuit board of a cell phone via the display circuit board connection 40. The main circuit board can, for example, comprise a microprocessor, which processes the results of the analysis of the capacitive sensor device and then, depending of the result, for example, sets the cell phone to a sleep mode or turns off the display of the cell phone when it is brought closer to the ear.

The flexible sections 20 shown in FIG. 7 can be arranged at the insides of the respective side walls when integrating the display circuit board 10 in a module housing, preferentially when the module housing is made of electrically non-conductive material.

When the module housing is made of an electrically conductive material, it is advantageous to lead the flexible sections 20 out of the module housing. The flexible sections 20 are then folded up when integrating the display module in the housing of an electrically hand-held device in such a way that they are substantially arranged between the outside of the side wall of the display module and the inside of the housing wall of the electrical hand-held device.

The electrical hand-held device can be a cell phone, a minicomputer (Personal Digital Assistant, PDA), a tablet PC, a remote control or any electrical hand-held device provided with a display.

LIST OF REFERENCE NUMBERS

10 display circuit board
20 flexible section of the display circuit board
30 electrode
30b electrode on the display frame
40 display circuit board connection
50 display
60 capacitive sensor device for approximation detection, touch detection and/or gesture detection
70 display connection (flat cable or flexible circuit board)
80 main circuit board, e.g. of an electrical hand-held device
90 display frame
100 display module
110 insulation layer
120 housing of the display module
130 housing of an electrical hand-held device

What is claimed is:

1. A display assembly comprising a display circuit board with a first section configured to receive a display such that the display is mounted on the first section and at least one flexible second section being configured as a flexible circuit board, wherein the at least one flexible second section of the display circuit board extends beyond a rim portion of the display and wherein the at least one flexible second section is folded against a sidewall of the display, wherein the folded flexible second section comprises at least one electrode at the sidewall which is coupled with a capacitive sensor device arranged on the display circuit board, and a module housing surrounding the display and the display circuit board, wherein the at least one electrode abuts against the inside of a side wall of the module housing, wherein a display circuit board connection is led out of the module housing, and wherein sensor signals of the capacitive sensor device can be transferred out of the display module through the display circuit board connection.

2. A display assembly according to claim 1, wherein the first section configured to receive the display forms a rigid portion of the display circuit board.

3. A display assembly according to claim 1, wherein the at least one electrode is configured as conductive ink on the display circuit board.

4. A display assembly according to claim 1, wherein the capacitive sensor device is an integrated circuit which is arranged on the display circuit board.

5. A display assembly according to claim 1, wherein the at least one electrode is configured as a conductive track of the display circuit board.

6. A display assembly according to claim 1, wherein the at least one electrode is electrically shielded.

7. A display assembly according to claim 1, wherein the capacitive sensor device comprises at least one electric circuit being configured to determine the capacitance at the at least one electrode.

8. A display assembly according to claim 7, wherein the electric circuit is configured to apply an alternating electrical signal to the electrode.

9. A display assembly according to claim 7, wherein the capacitive sensor device is integrated in the electric circuit of a display driver on the display circuit board.

10. A display assembly according to claim 1, wherein the at least one electrode is configured to establish a capacitive coupling between electrically conductive sections of a display module housing and the capacitive sensor device.

11. A display module with a display and a display circuit board comprising a section configured to receive the display such that the display is mounted on said section and at least one flexible section being configured as a flexible circuit board, wherein the at least one flexible section of the display circuit board extends beyond a rim portion of the display and wherein the at least one flexible section is folded against a sidewall of the display, wherein the folded flexible section comprises at least one electrode at the sidewall which is coupled with a capacitive sensor device, wherein the display module further comprises a module housing, in which the display and the display circuit board are arranged, wherein the at least one electrode abuts against the inside of a side wall of the module housing, wherein a display circuit board connection is led out of the module housing, which can be configured as a flexible circuit board and wherein the capacitive sensor device is arranged on the display circuit board and wherein sensor signals of the capacitive sensor device can be transferred out of the display module through the display circuit board connection.

12. A display module according to claim 11, wherein at least a part of the at least one flexible section of the display circuit board is led out of the module housing.

13. A display module according to claim 11, wherein the display circuit board comprises four electrodes, wherein the first electrode, the second electrode and the third electrode are provided for a touch detection and the fourth electrode together with at least one of the first electrode, the second electrode and the third electrode are provided for an approximation detection.

14. A display module according to one claim 11, wherein the module housing is made of plastic.

15. Electrical hand-held device with a display module according to claim 11.

16. A method for the production of a display module comprising:
    mounting a display at least partially on a display circuit board comprising at least one flexible section being configured as a flexible circuit board and extending beyond a rim portion of the display, wherein the at least one flexible section of the display circuit board comprises at least one electrode configured to be coupled with a capacitive sensor device arranged on the display circuit board, and
    folding the at least one flexible section against a sidewall of the display such that the at least one electrode is at the sidewall,
    arranging the display and the display circuit board in a module housing, wherein the at least one electrode abuts against the inside of a side wall of the module housing and wherein a display circuit board connection is led out of the module housing and wherein sensor signals of the capacitive sensor device can be transferred out of the display module through the display circuit board connection.

17. A display assembly comprising a display circuit board having a first section onto which a display is mounted and at least one flexible second section being configured as a flexible circuit board, wherein the at least one flexible second section of the display circuit board extends beyond a rim portion of the display and wherein the at least one flexible second section is folded against a sidewall of the display and comprises at least one electrode arranged on the flexible second section which rests on the sidewall and which is configured to be coupled with a capacitive sensor device, wherein the display module further comprises a module housing, in which the display and the display circuit board are arranged, wherein the at least one electrode abuts against the inside of a side wall of the module housing, wherein a display circuit board connection is led out of the module housing, which can be configured as a flexible circuit board and wherein the capacitive sensor device is arranged on the display circuit board and wherein sensor signals of the capacitive sensor device can be transferred out of the display module through the display circuit board connection.

18. A method according to claim 16, further comprising applying an insulation layer at least on a section of the display on which the folded flexible section rests.

* * * * *